(12) United States Patent
Proudfoot et al.

(10) Patent No.: US 8,354,652 B2
(45) Date of Patent: Jan. 15, 2013

(54) ION SOURCE INCLUDING SEPARATE SUPPORT SYSTEMS FOR ACCELERATOR GRIDS

(75) Inventors: Gary Proudfoot, Oxford (GB); Gordon Robert Green, Bristol (GB); Robert Kenneth Trowell, Bristol (GB)

(73) Assignee: Aviza Technology Limited, Newport, Wales (GB)

( * ) Notice: Subject to any disclaimer, the term of this patent is extended or adjusted under 35 U.S.C. 154(b) by 84 days.

(21) Appl. No.: 12/309,460

(22) PCT Filed: Jul. 12, 2007

(86) PCT No.: PCT/GB2007/002614
§ 371 (c)(1),
(2), (4) Date: Aug. 14, 2009

(87) PCT Pub. No.: WO2008/009898
PCT Pub. Date: Jan. 24, 2008

(65) Prior Publication Data
US 2009/0309042 A1     Dec. 17, 2009

Related U.S. Application Data

(60) Provisional application No. 60/832,428, filed on Jul. 20, 2006.

(30) Foreign Application Priority Data

Jul. 21, 2006   (GB) ................................. 0614501.5

(51) Int. Cl.
*G21K 1/08* (2006.01)
*H01J 3/14* (2006.01)
*H01J 49/42* (2006.01)
*F03H 1/00* (2006.01)

(52) U.S. Cl. ............. 250/396 R; 250/492.21; 313/359.1
(58) Field of Classification Search ............... 250/423 R, 250/423 F, 396 R, 492.3, 492.21; 313/360.01, 313/363.1, 362.1, 238, 243–266, 293; 315/5.41
See application file for complete search history.

(56) References Cited

U.S. PATENT DOCUMENTS
2,916,649 A * 12/1959 Levin ............................ 313/250
(Continued)

FOREIGN PATENT DOCUMENTS
EP        0 360 608 A1      3/1990
(Continued)

OTHER PUBLICATIONS
Great Britain Search Report for GB0614499.2 dated Nov. 22, 2006, 1 pg. claims searched 1.
(Continued)

*Primary Examiner* — Phillip A Johnston
*Assistant Examiner* — Brooke Purinton
(74) *Attorney, Agent, or Firm* — Volentine & Whitt, PLLC

(57) ABSTRACT

This invention relates to an Ion gun (10) which comprises of plasma generator (11) driven from an RF source (12), a plasma or source chamber (13), having an outlet (14), across which is mounted an accelerator grid (15). The accelerator grid (15) comprises four individual grids. The first grid (16), which is closest to the outlet (14), is maintained at a positive voltage by a DC source (16a), the second grid (17) is maintained strongly negative by DC source (17a). The third grid (18) is maintained at a negative voltage, which is much lower than that of the second grid (17), by DC source (18a) and the fourth grid is grounded. Means of mounting these grids are also described.

21 Claims, 7 Drawing Sheets

U.S. PATENT DOCUMENTS

| | | | |
|---|---|---|---|
| 3,864,797 A | 2/1975 | Banks | |
| 4,232,244 A | 11/1980 | Fink et al. | |
| 4,447,773 A | 5/1984 | Aston | |
| 4,857,800 A | 8/1989 | Ohkoshi et al. | |
| 4,873,467 A * | 10/1989 | Kaufman et al. | 313/360.1 |
| 4,987,346 A | 1/1991 | Katzschner et al. | |
| 4,990,229 A * | 2/1991 | Campbell et al. | 204/298.06 |
| 4,992,665 A | 2/1991 | Mohl | |
| 5,036,252 A | 7/1991 | Lob | |
| 5,107,170 A | 4/1992 | Ishikawa et al. | |
| 5,247,225 A * | 9/1993 | Nakatani et al. | 313/495 |
| 5,296,122 A | 3/1994 | Katsube et al. | |
| 5,559,391 A * | 9/1996 | Valentian | 313/360.1 |
| 5,786,039 A | 7/1998 | Brouquet | |
| 5,871,622 A | 2/1999 | Pinarbasi | |
| 5,874,367 A | 2/1999 | Dobson | |
| 5,924,277 A | 7/1999 | Beattie et al. | |
| 6,150,755 A * | 11/2000 | Druz et al. | 313/359.1 |
| 6,214,698 B1 | 4/2001 | Liaw et al. | |
| 6,224,718 B1 | 5/2001 | Meyer | |
| 6,246,162 B1 * | 6/2001 | Kahn et al. | 313/360.1 |
| 6,339,206 B1 | 1/2002 | Johnson | |
| 6,346,768 B1 * | 2/2002 | Proudfoot | 313/359.1 |
| 6,387,989 B1 | 5/2002 | Sulzbach et al. | |
| 6,395,156 B1 | 5/2002 | Hsueh et al. | |
| 6,395,647 B1 | 5/2002 | Li et al. | |
| 6,544,858 B1 | 4/2003 | Beekman et al. | |
| 2002/0060201 A1 | 5/2002 | Yeom et al. | |
| 2002/0175296 A1 | 11/2002 | Kimura et al. | |
| 2002/0185226 A1 | 12/2002 | Lea et al. | |
| 2003/0047536 A1 | 3/2003 | Johnson | |
| 2003/0157781 A1 | 8/2003 | Macneil et al. | |
| 2003/0227258 A1 | 12/2003 | Strang et al. | |
| 2004/0023125 A1 | 2/2004 | Nozawa et al. | |
| 2004/0084299 A1 | 5/2004 | Slaughter | |
| 2004/0212288 A1 | 10/2004 | Kanarov et al. | |
| 2005/0159010 A1 | 7/2005 | Bhardwaj et al. | |
| 2005/0194097 A1 | 9/2005 | Uchiyama | |
| 2005/0241767 A1 | 11/2005 | Ferris et al. | |
| 2006/0019039 A1 | 1/2006 | Hanawa et al. | |
| 2006/0060795 A1 | 3/2006 | Takeuchi et al. | |
| 2006/0068181 A1 * | 3/2006 | Dory et al. | 428/209 |

FOREIGN PATENT DOCUMENTS

| | | |
|---|---|---|
| EP | 0 496 564 A1 | 7/1992 |
| EP | 0 532 283 | 3/1993 |
| GB | 1057119 | 2/1967 |
| GB | 1138212 | 12/1968 |
| GB | 1295465 | 11/1972 |
| GB | 2 295 485 A | 5/1996 |
| GB | 2 327 909 | 2/1999 |
| GB | 2 364 434 | 1/2002 |
| JP | 58-189952 | 11/1983 |
| JP | 4-194372 A | 7/1992 |
| JP | 5-74361 A | 3/1993 |
| JP | 7-169426 | 7/1995 |
| JP | 7-230987 | 8/1995 |
| JP | 8-139024 | 5/1996 |
| JP | 08 335447 | 12/1996 |
| JP | 2001 20068 | 1/2001 |
| JP | 2003-17472 | 1/2003 |
| WO | WO 98/14977 A1 | 4/1998 |
| WO | WO 98/18150 A1 | 4/1998 |
| WO | WO 00/36631 A1 | 6/2000 |
| WO | WO 01/22470 A1 | 3/2001 |
| WO | WO 02/33725 A2 | 4/2002 |
| WO | WO 02/097850 A2 | 12/2002 |
| WO | WO 2005/024881 A2 | 3/2005 |
| WO | WO 2008/009892 A1 | 1/2008 |

OTHER PUBLICATIONS

Spaepen, F. et al., "Ion Beam Sputtering Apparatus for Fabrication of Compositionally Modulated Materials," Review of Scientific Instruments, AIP, Melville, NY, US, vol. 56, No. 7, Jul. 1985, pp. 1340-1343.

International Search Report and Written Opinion for PCT/GB2007/002550 dated Oct. 12, 2007, 13 pages.

International Search Report and Written Opinion for PCT/GB2007/002614 dated Nov. 2, 2007, 13 pages.

International Search Report for PCT/GB2007/002537 dated Dec. 14, 2007, 5 pages.

Great Britain Search Report for GB0614500.7 dated Nov. 29, 2006, 1 pg. claims searched all.

Great Britain Search Report for GB0614501.5 dated Nov. 29, 2006, claims searched 1-15.

Great Britain Search Report for GB0614501.5 dated Jun. 1, 2007, 1 page, claims searched 16 to 18.

Great Britain Search Report for GB0614501.5 dated Jun. 1, 2007, 1 page, claim searched 19.

Great Britain Search Report for GB0614499.2 dated Jul. 2, 2007, 1 pg, claims searched 6-31.

* cited by examiner

ION SOURCE INCLUDING SEPARATE SUPPORT SYSTEMS FOR ACCELERATOR GRIDS

CROSS REFERENCE TO RELATED APPLICATIONS

This Application is a United States National Stage Application filed under 35 U.S.C. §371 of PCT Patent Application Serial No. PCT/GB2007/002614 filed on Jul. 12, 2007, which claims the benefit of and priority to Great Britain (GB) Patent Application Serial No. 0614501.5 filed on Jul. 21, 2006 and U.S. Provisional Patent Application Ser. No. 60/832,428 filed on Jul. 20, 2006, the disclosures of both of which are hereby incorporated by reference in their entirety.

This invention relates to ion sources and in particular, but not exclusively to sources for producing broad ion beams.

It has been known for much of the past century that a way of producing a beam of ions is to create a plasma within a region and to draw a stream of ions from that region using some form of accelerator grid arrangement. Much of the work was done in the field of triode valves but in succeeding decades ion guns were developed, which mainly used a three grid arrangement although four grids also came into play. The purpose of these different configurations is discussed in U.S. Pat. No. 6,346,768, which illustrates both a three electrode and a four electrode arrangement.

Guns of the type described in U.S. Pat. No. 6,346,768 are particularly designed for use on ion beam processing apparatus, where often the beam may need to travel up to half a meter before striking its intended target. The divergence of the beam then becomes a significant issue and existing apparatus experiences many problems particularly arising from the accurate support of the grids, the insulation which can be maintained between the grids, the detrimental effects of reverse sputtering; and the lack of uniformity in the plasma.

Different embodiments of the invention seek to address some or all of these issues.

Thus from one aspect the invention consists in an ion source including a chamber for containing a plasma and having an outlet for ions; and an accelerator mounted at the outlet for drawing a stream of ions from the plasma and forming them into a beam, in a direction, wherein the accelerator includes four spaced generally parallel grids, the second to fourth grids numbered in the direction being located by two sets of supports wherein one set supports the second and fourth grids and the other set supports the third grid.

In the usual prior art arrangement the second grid is supported on the first grid and in turn supports the third grid, which supports the fourth grid. This provides significant limitations, particularly in the length of the insulation that can be placed between the first and second grids and hence limits the voltage which can be applied to the second grid, which will normally carry the main accelerating voltage.

With the applicant's arrangement, the second grid does not need to be supported on the first grid, but instead its support can pass through an aperture of the first grid to engage the chamber wall or an extension thereof and indeed can sit in a recess in such a wall or extension. The insulator length can therefore be significantly extended. Similarly the support for the third grid can pass through the first grid.

In a preferred embodiment at least one of the supports of the first set includes an insulator extending from the second grid to the fourth grid and additionally or alternatively at least one of the supports of the second grid includes an insulator extending from a wall of the chamber which defines the outlet, or an extension thereof, to the third grid. Optionally, at least one of the supports of the other set may include an insulator extending from the third grid to the fourth grid. It is particularly preferred that the above mentioned insulators are present on all respective supports.

It is also preferred that at least some of the insulators include formations, which will create sputter shadows to prevent reverse sputtering creating a conductive path over the full length of the insulator. Such formations can also be formed in such a way as to increase the tracking length on the surface of the insulator.

In any of the above cases the first grid may be mechanically pre-stressed to present a concave or convex profile in the direction about one axis. Currently it is found that the first grid, if made flat, will often distort under the heat generated by the plasma, which destroys the design set up of the accelerator and hence the quality of the beam, or, as in U.S. Pat. No. 6,346,768 a concave curve is preformed into the grid and the grid is heat treated so as to fix this configuration. The applicants have appreciated that the mechanical pre-stressing enables a precise design configuration to be achieved, which will not distort under heat, but which does not require expensive preheat treatments. As the pre-stressing is in one dimension it can be machined into the chamber wall or other component against which the first grid may be clamped, thus avoid expensive heat treatment. They further appreciated that, contrary to what is taught in U.S. Pat. No. 6,346,768, that a convex curve is desirable, because this will to some extent address plasma non-uniformity or allows the possibility of the plasma density being matched to a particular design configuration, because when pre-stressed the first grid will stay where it is designed to be. The concave profile can be used to provide a 'hollow' beam.

The grid is generally rectangular and the axis is the longitudinal axis.

At least some of the openings in a grid adjacent its periphery may be smaller in cross-section than those located in a central region. It had previously been thought that the outer holes or openings should be bigger to increase the current flow adjacent the walls of the plasma chamber, where the plasma density is reduced. The inventors have appreciated that, surprisingly, this is the wrong approach and their proposal will give a beam with reduced divergence. In general the cross-section of the openings may be proportional to the anticipated local plasma density. The source may include a plurality of plasma generators, which when the source is rectangular or elongate can be spaced along its length.

From another aspect the invention consists a generally rectangular grid for an ion accelerator wherein the grid is mechanically prestressed to present a convex or concave profile in the one direction in the dimension.

In a particular embodiment the profile occurs when the grid is pre-stressed during assembly.

From another aspect the invention consists in a grid for an ion accelerator wherein at least some of the openings in a grid adjacent its periphery are smaller in cross-section than those located in a central area of the grid.

Although the invention has been defined above it is to be understood that it includes any inventive combination of the features set out above or in the following description.

The invention may be performed in various ways and specific embodiments will now be described, by way of example, with reference to the accompanying drawings in which.

Figure 7:
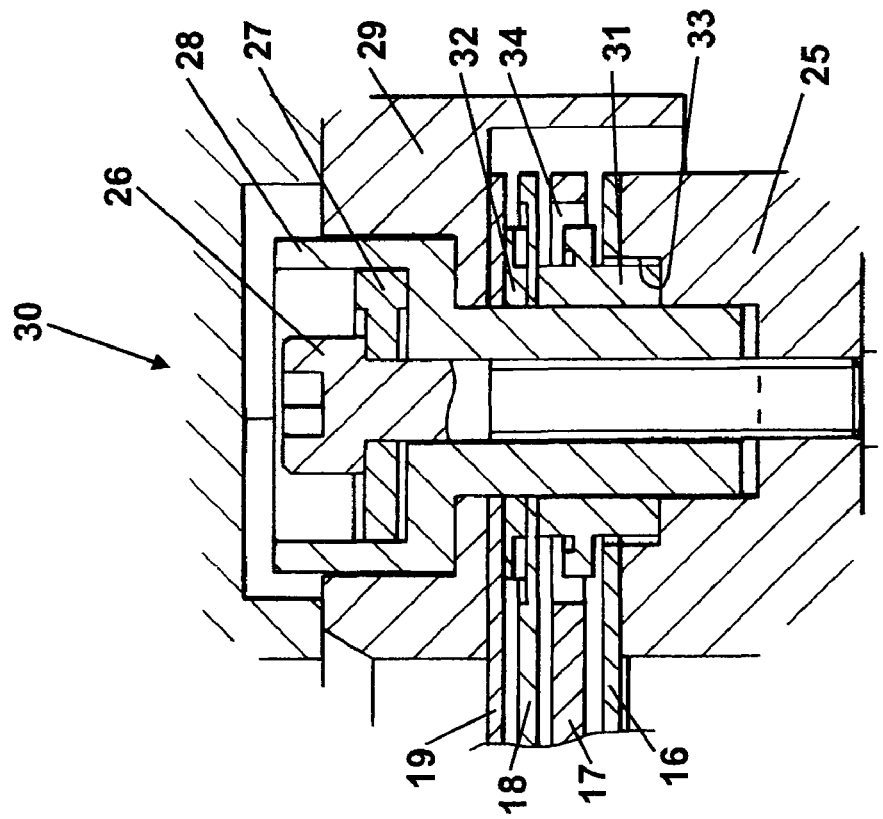
FIG. 7 is a cross-sectional view through an accelerator grid showing one of a first set of supports.
Figure 8:
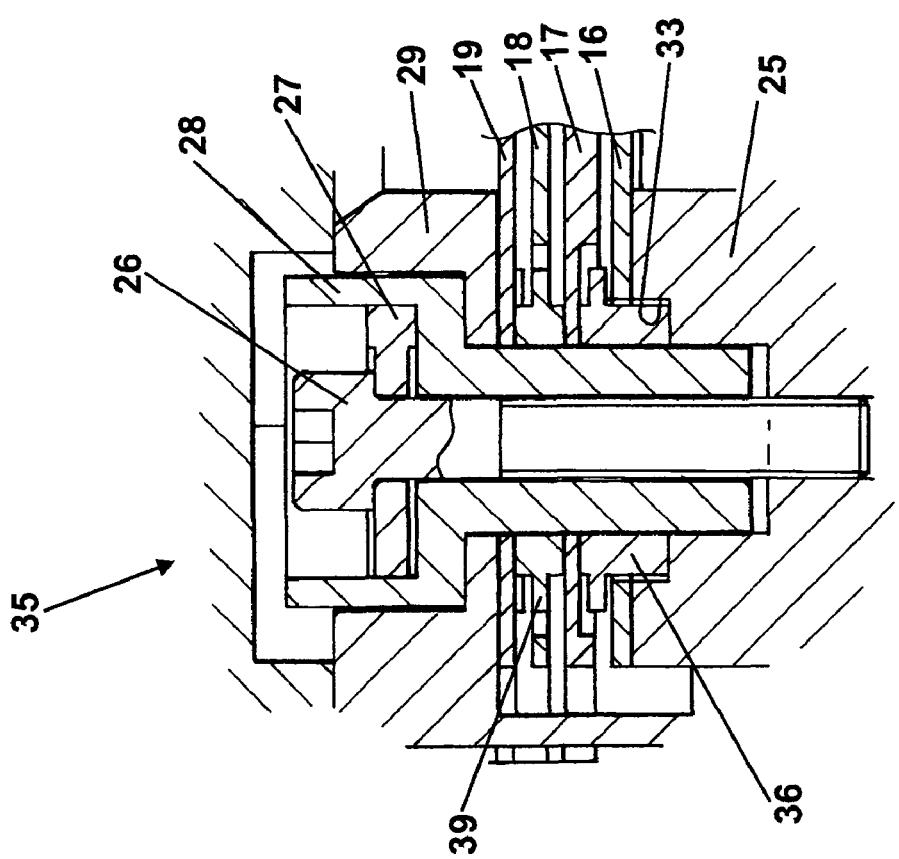
FIG. 8 is a corresponding view to FIG. 8 through one of the second set of supports.
Figure 9:
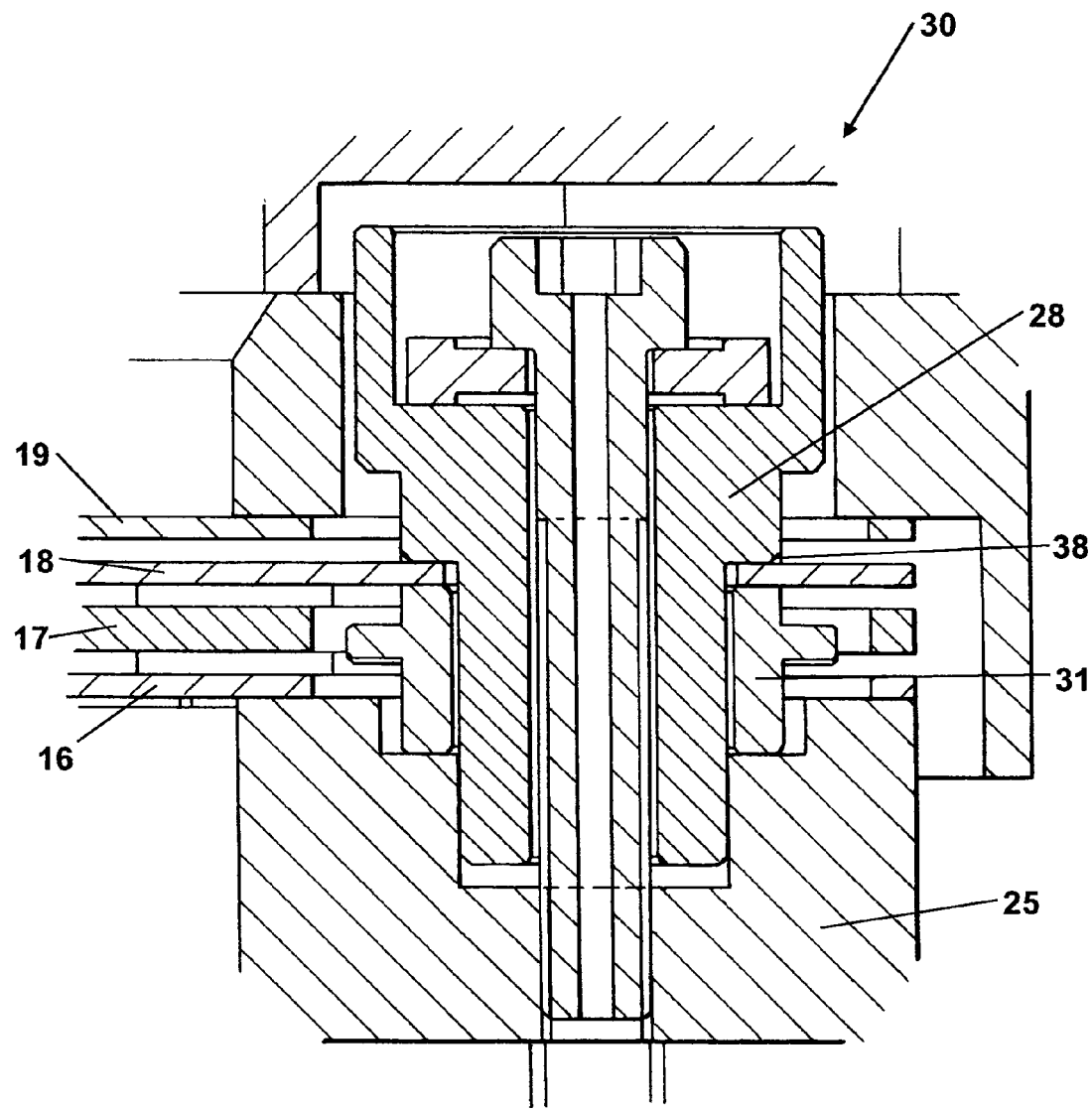
Figure 10:
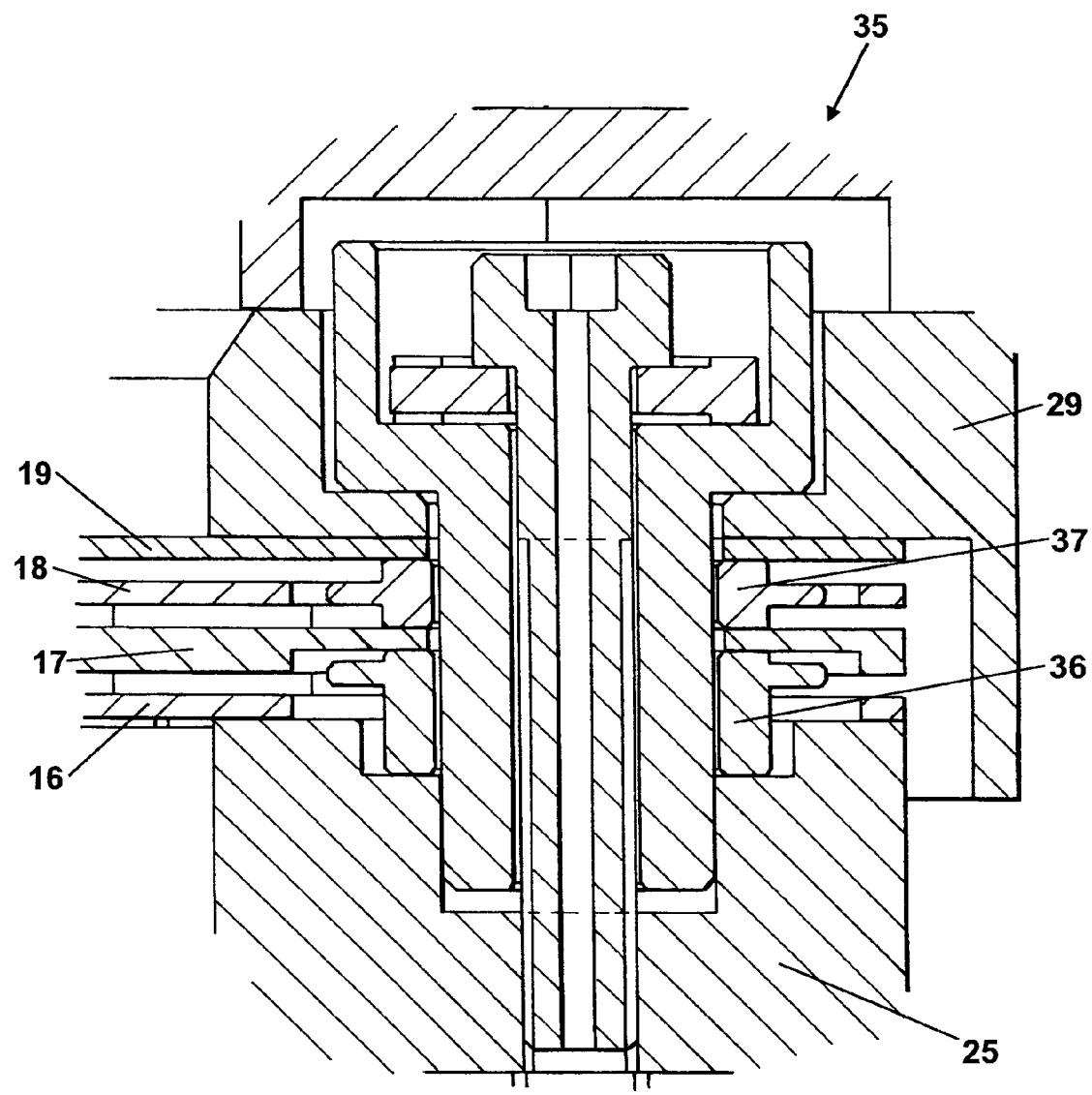
Figure 11:
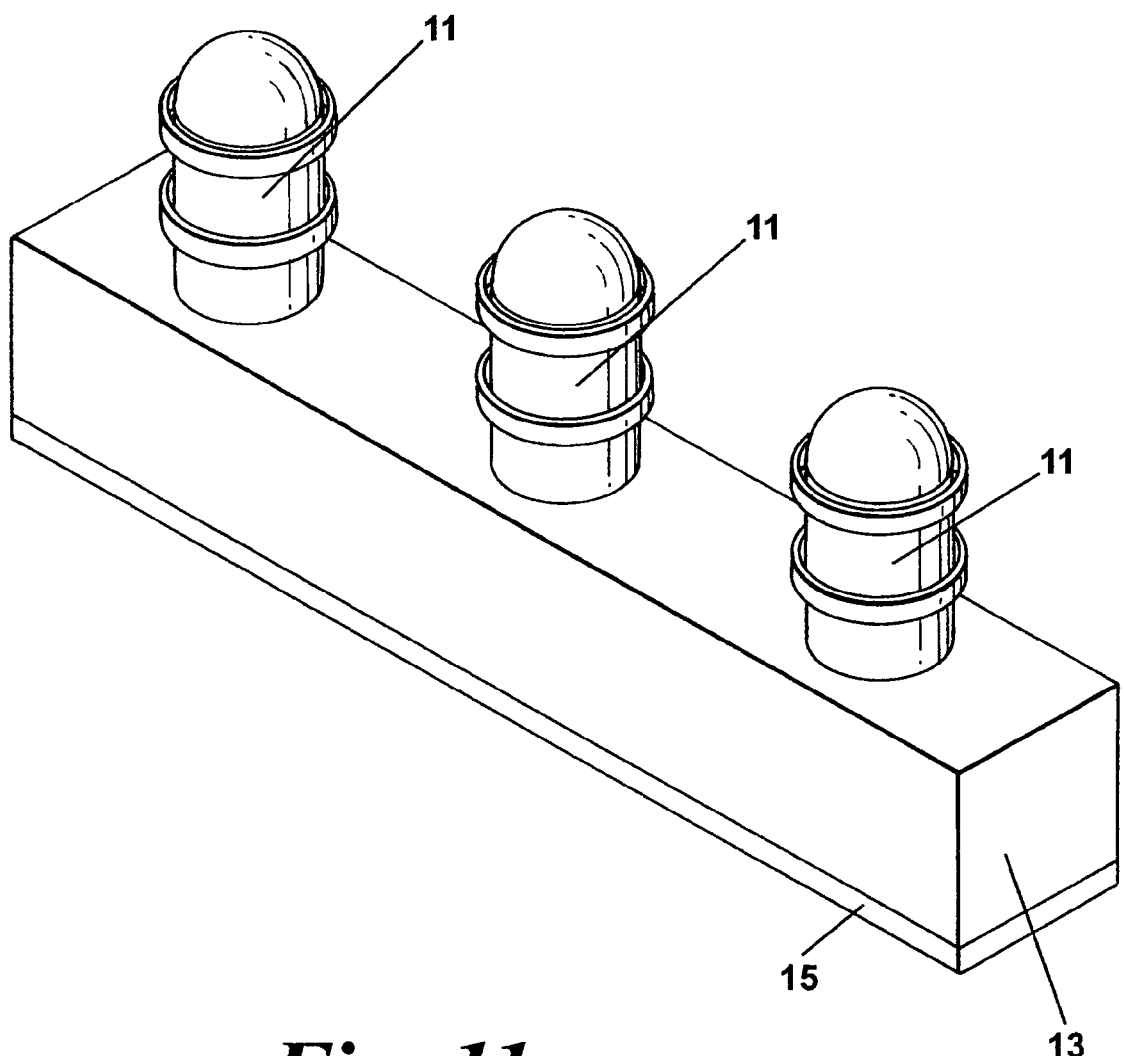

FIGS. 9 and 10 correspond to FIGS. 7 and 8 respectively for an alternative embodiment; and FIG. 11 is a schematic view of a multi-antenna source.

Figure 1:
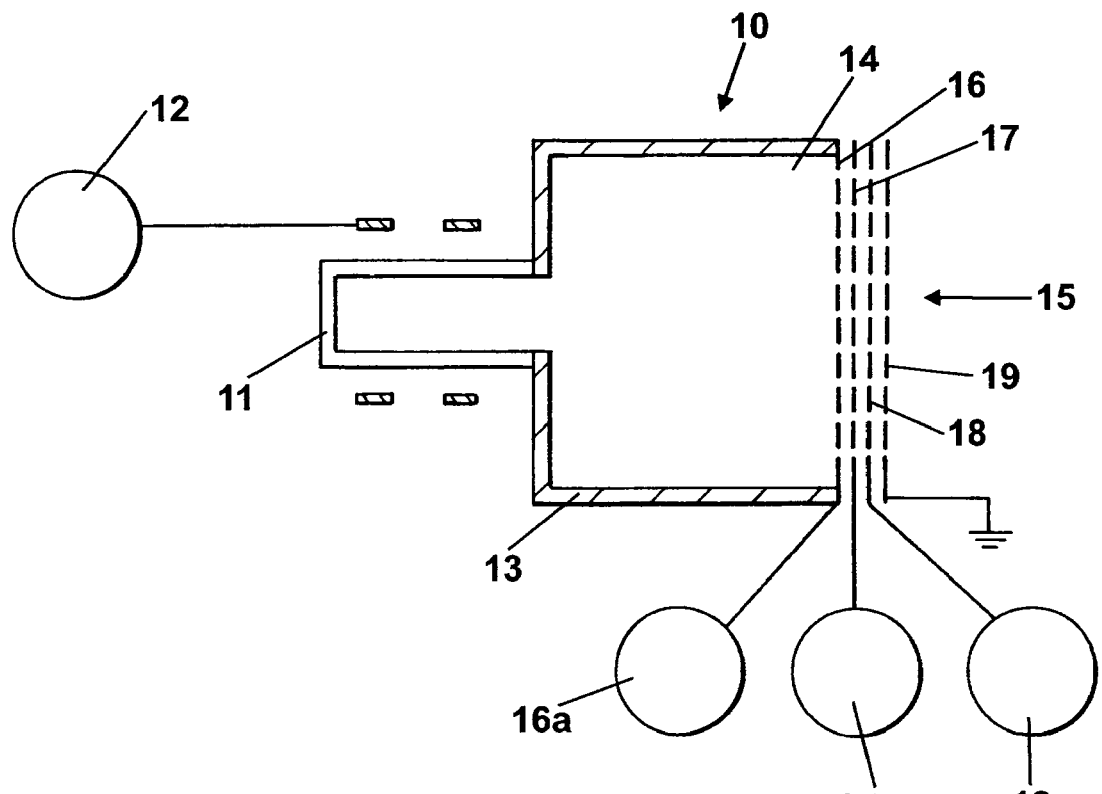
FIG. 1 is a schematic diagram of an ion gun.

An ion gun, 10, is schematically shown in FIG. 1. It comprises a plasma generator 11 driven from an RF source 12, a plasma or source chamber 13, having an outlet 14, across which is mounted an accelerator grid 15. The accelerator grid 15 comprises four individual grids. The first grid 16, which is closest to the outlet 14 is maintained at a positive voltage by DC source 16a, the second grid 17 is maintained strongly negative by DC source 17a. The third grid 18 is maintained at a negative voltage, which is much lower than that of the second grid 17, by DC source 18a and the fourth grid 19 is grounded.

Figure 2:
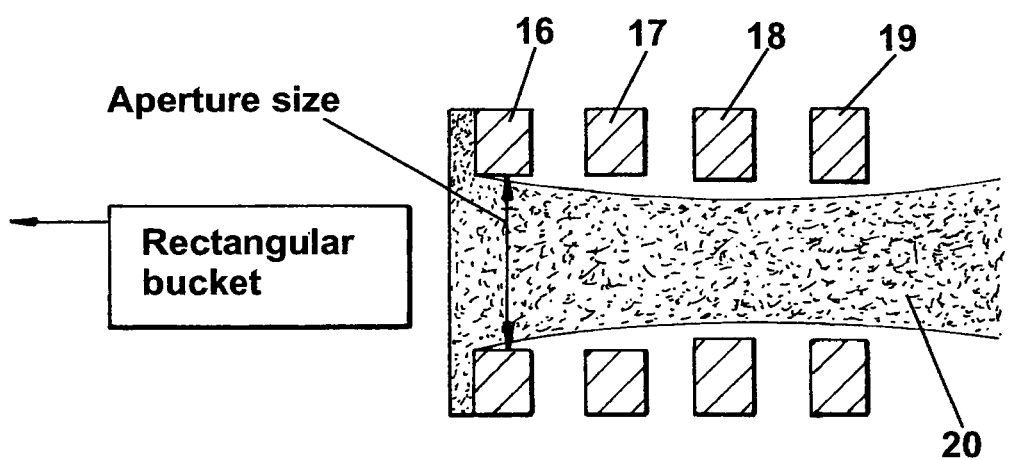
FIG. 2 is a schematic view of the accelerator grid of the gun of FIG. 1 on an enlarged scale.

For reasons highlighted below, the applicants are able to run the second grid 17 at around −2000V or even higher. This has a dual effect of creating a good electric lens, between plates 16 and 17. The result of this is shown in FIG. 2 where the ion beam 20 is focused between plates 16 and 17. The high negative voltage on grid 17 also significantly accelerates the ions in the beam 20 and accordingly reduces the divergence creating effect of the transverse focusing forces over the operational length of throw of the ion beam 20.

Grid 18 is at a much smaller negative voltage allowing the ground voltage of grid 19 to be achieved in two decelerating steps, without causing significant divergence of the beam 20.

The positive, negative, negative, ground arrangement of the grids also significantly reduces the likelihood of a reverse electron current, which could cause voltage collapse and instability.

Figure 3:
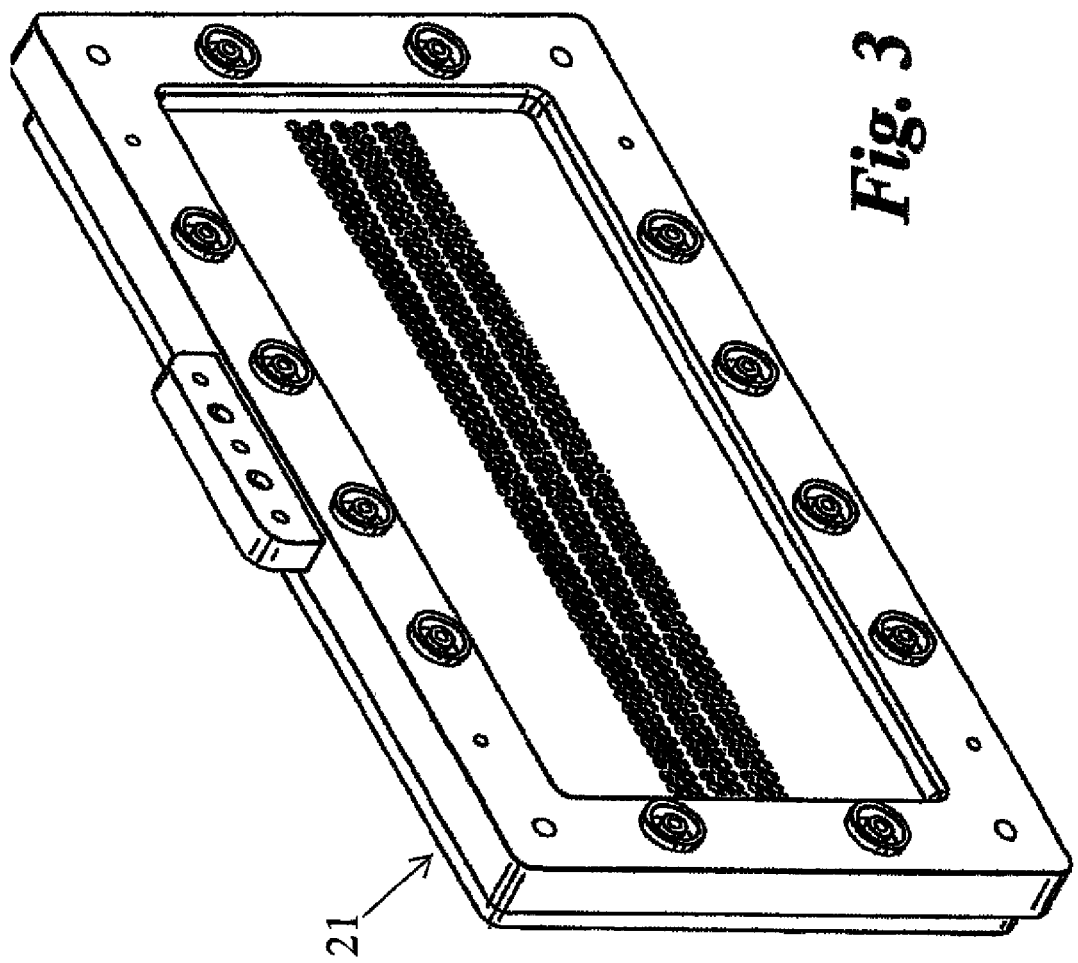
FIG. 3 is a view from the front and one side of a grid assembly for use with the ion gun of FIG. 1.
Figure 5:
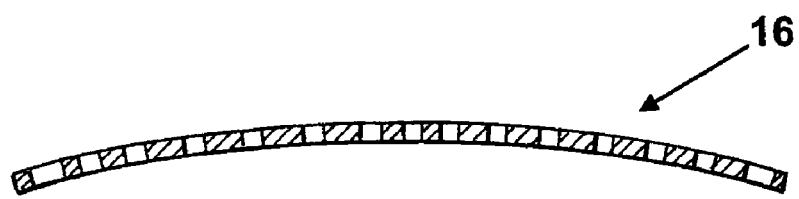
FIG. 5 is a cross-sectional view of the grid of FIG. 4 along the line A-A with the curvature exaggerated.
Figure 4:
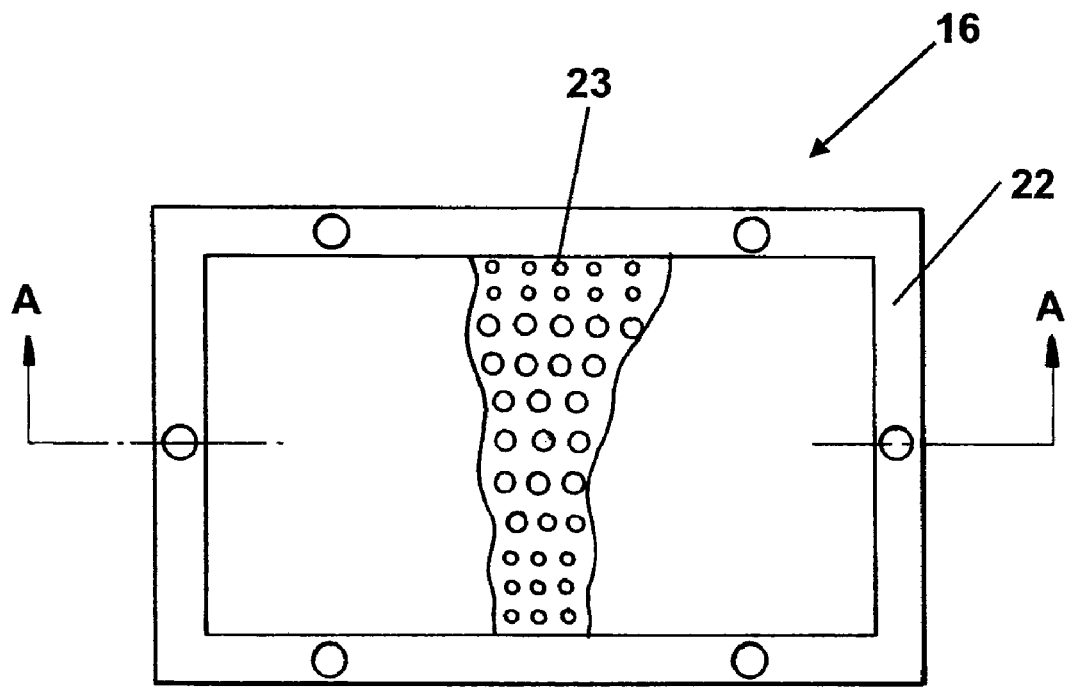
FIG. 4 is a plan view of the first grid for use with an ion gun of FIG. 1.
Figure 6:
FIG. 6 is an end view of the grid of FIG. 4.

FIG. 3 shows a grid assembly. The grids 14 to 19 can be attached to the chamber 13 through frame assembly 21 and are themselves connected to the frame 22 as described below. Turning to FIGS. 4 to 6 it should first be noted that the openings 23 in the grid 16 are smaller nearer the periphery than in the centre, for the reasons previously discussed. Secondly, as shown in FIG. 7 grid 16 is mechanically pre-stressed in a slight longitudinal convex curve, which is exaggerated in the drawing, to overcome the heat effects previously mentioned. Conveniently this curvature, which may hardly be visible, may be machined in to the chamber wall against which the first grid is clamped, thus avoiding expensive heat treatments. Alternatively the curve may be concave, which can produce a hollow beam.

It will be noted that in the frame 22 there are openings 23 through which support pass and in which voltage connections such as indicated in FIG. 3 at 24 may be attached.

It is proposed, as can be seen in FIGS. 7 and 8, that two different forms of supports should be used. Each support includes a central core which enables the support to be located in the wall 25 of the source chamber 13. In each case the central core includes a screw 26, a washer 27, a sleeve 28 and a clamp 29, which may be the frame 22. As will be well understood by one skilled in the art, this arrangement can be used to hold the grids 16 to 19 in compression and to thus locate them vertically and laterally subject to interconnections between them.

One of the supports, which constitutes the first set, as previously mentioned, is illustrated at 30. This further includes two annular insulators 31 and 32. It will be seen that the insulator 31 is able to pass through the grid 16 to sit in a recess 33 in the wall 25. It then passes upwardly through an opening 34 in the second grid 17 to support the third grid 18. The insulator 32 in turn sits on the grid 18 to support the grid 19. This effectively decouples the second grid from the third grid in mechanical terms whilst providing a long insulator 33 between the chamber 25 and the third grid 18.

A member of the second set of supports is illustrated in FIG. 8 at 35. Here the lower annular insulator 36 supports the second grid 17 and the upper annular insulator 39 in turn supports the fourth grid 19. In this way both the second and third grid as dimensionally referenced to the wall 25 and the fourth grid 19, but without being engaged with each other. This enables the insulator 36 to pass through the first grid 16, rather than sitting on it so that the advantage of the recess 33 can once more be gained and it also allows for the convex curve to be introduced into the grid 16 without losing accuracy in the positioning of the remaining grids.

FIGS. 9 and 10 illustrate an alternative arrangement in which the fourth grid 19 is not supported on the third grid 18 and the sleeve 28 is provided with a shoulder 38 to clamp the third grid 18.

The grids 16 to 19 are described as generally parallel despite the curvature of the grid 16. As that grid is generally planar in configuration the phrase will be well understood by those skilled in the art.

In FIG. 11 a single large (e.g. 150 mm×900 mm) chamber 13 is supplied by three plasma generators 11. As illustrated the generators 11 are MORI® sources supplied by Aviza Technology Inc., but any suitable generator may be used. The accelerator grid is shown at 15. Multiple generator sources of this type can be used for provide broad beam for processing large substrates e.g. flat screen displays.

As has previously been indicated the ion source of the invention can be used in a broad ion beam deposition apparatus and because of the low divergence of the beam achieved, it is particularly suitable for that purpose.

The invention claimed is:

1. An ion source comprising:
   a chamber for containing a plasma and including an outlet for ions; and
   an accelerator mounted at the outlet for drawing a stream of ions from the plasma and forming them into a beam traveling in a given direction, wherein the accelerator includes first through fourth generally parallel grids which are spaced apart and juxtaposed in numerical order in the given direction;
   a first set of supports comprising a plurality of first support elements which pass through respective first openings in the first through fourth grids, wherein each of the first support elements is mechanically decoupled from the second grid and supports a position of the third grid; and
   a second set of supports comprising a plurality of second support elements which pass through respective second openings in the first through fourth grids, each of the second openings spaced apart from each of the first openings, wherein each of the second support elements is mechanically decoupled from the third grid and supports a position of the second grid.

2. A source as claimed in claim 1 wherein each of the second support elements further supports a position of the fourth grid.

3. A source as claimed in claim 1 wherein at least one of the second support elements includes an insulator extending from a wall of the chamber which defines the outlet, or an extension thereof, to the second grid.

4. A source as claimed in claim 2 wherein at least one of the second support elements includes an insulator extending from the second grid to the fourth grid.

5. A source as claimed in claim 1 wherein at least one of the first support elements includes an insulator extending from a wall of the chamber which defines the outlet, or an extension thereof, to the third grid.

6. A source as claimed in claim 1 wherein at least one of the first support elements includes an insulator extending from the third grid to the fourth grid.

7. A source as claimed in claim 3 wherein the chamber wall or the extension thereof includes at least one recess for receiving an insulator.

8. A source as claimed in claim 1 wherein the first grid is mechanically pre-stressed to present a concave or convex profile in the given direction in one dimension.

9. A source as claimed in claim 8 wherein the first grid is generally rectangular.

10. A source as claimed in claim 8 wherein the first grid is concave or convex about a longitudinal axis of the first grid.

11. A source as claimed in claim 1 wherein each of the first through fourth grids further include a plurality of grid openings, and at least some of the grid openings in at least one of the first through fourth grids adjacent its periphery are smaller in cross-section than those located in a central area of the grid.

12. A source as claimed in claim 1 wherein the cross-section of the grid openings in at least one of the first through fourth grids are proportional to the designed local plasma density within the plasma volume.

13. A source as claimed in claim 1 including a plurality of plasma generators.

14. A source as claimed in claim 13 wherein the chamber is elongate and the plasma generators are arranged along its length.

15. An ion source comprising:
a chamber for containing a plasma and including an outlet for ions; and
first, second, third and fourth grids disposed at the outlet for drawing a stream of ions from the plasma and forming them into a beam traveling in a given direction, wherein the grids are spaced apart and juxtaposed in numerical order in the given direction, and each of the grids have respective first openings and second openings extending axially therethrough, respectively, at locations spaced from one another adjacent outer peripheries of the grids; and
a support structure that clamps the grids at outer peripheral portions thereof to a wall of the chamber, or an extension thereof, that defines the outlet such that the outer peripheral portions of the grids are compressed together,
the support structure comprising a set of first supports and a set of second supports,
each of the first supports passing through respective ones of the first openings in the first through fourth grids, and including at least one first annular insulator having an annular substantially flat end surface engaged with the third grid, and
each of the second supports passing through respective ones of the second openings in the first through fourth grids, and including at least one second annular insulator having an annular substantially flat end surface engaged with the second grid, and
wherein each of the first supports is mechanically decoupled from the second grid, and the third grid is held in place by part of the support structure which includes the set of first supports, and
each of the second supports is mechanically decoupled from the second grid, and the second grid is held in place by part of the support structure which includes the set of second supports.

16. A source as claimed in claim 15, wherein each of the first supports also includes a first core member extending axially through the at least one first annular insulator of the first support and the respective ones of the first openings in the first through fourth grids,
part of the support structure which includes the first core member of each of the first supports clamps the third grid and the at least one first annular insulator of each of the first supports to the wall of the chamber or the extension thereof,
each of the second supports also includes a second core member extending axially through the at least one second annular insulator of the second support and the respective ones of the first openings in the first through fourth grids, and
part of the support structure which includes the second core member of each of the second supports clamps the second grid and the at least one second annular insulator of the second support to the wall of the chamber or the extension thereof.

17. A source as claimed in claim 15 wherein the first supports are each mechanically decoupled from the fourth grid, and the part of the support structure which includes the second supports holds the fourth grid in place.

18. A source as claimed in claim 15 wherein the at least one annular insulator of each of the second supports comprises an annular insulator extending axially from the wall of the chamber, or the extension thereof, through a respective one of the second openings in the first grid and to the second grid.

19. A source as claimed in claim 18 wherein the at least one annular insulator of each of the second supports also comprises an annular insulator extending axially from the second grid through a respective one of the second openings in the third grid and to the fourth grid.

20. A source as claimed in claim 15 wherein the at least one annular insulator of each of the first supports comprises an annular insulator extending axially from the wall of the chamber, or the extension thereof, through respective ones of the first openings in the first and second grids and to the third grid.

21. A source as claimed in claim 16, wherein the support structure further comprises a frame, the outer peripheral portions of the grids are interposed between the frame and the wall of the chamber or the extension thereof, and the core members of the first and second supports clamp the frame to the wall of the chamber, or the extension thereof, such that the outer peripheral portions of the grids are compressed between the frame and the wall of the chamber or the extension thereof.

* * * * *